United States Patent
Hirose (10) Patent No.: US 12,494,371 B2
(45) Date of Patent: Dec. 9, 2025

(54) PROCESSING METHOD

(71) Applicant: DISCO CORPORATION, Tokyo (JP)

(72) Inventor: Tsubasa Hirose, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 592 days.

(21) Appl. No.: 18/047,739

(22) Filed: Oct. 19, 2022

(65) Prior Publication Data
US 2023/0141691 A1    May 11, 2023

(30) Foreign Application Priority Data

Nov. 5, 2021   (JP) ................. 2021-181180

(51) Int. Cl.
| H01L 21/268 | (2006.01) |
| B23K 26/08 | (2014.01) |
| B23K 26/57 | (2014.01) |
| H01L 21/78 | (2006.01) |

(52) U.S. Cl.
CPC ........ *H01L 21/268* (2013.01); *B23K 26/0823* (2013.01); *B23K 26/57* (2015.10); *H01L 21/78* (2013.01); *H01L 2221/6834* (2013.01)

(58) Field of Classification Search
CPC ............. H01L 21/268; H01L 21/78; H01L 2221/6834; B23K 26/0823; B23K 26/57; B23K 26/53; B23K 26/00; B23K 26/38; B23K 2101/40; B23K 26/364; B24B 37/042
See application file for complete search history.

(56) References Cited

U.S. PATENT DOCUMENTS

2019/0030648 A1*  1/2019  Priewasser .......... H01L 21/3065

FOREIGN PATENT DOCUMENTS

| DE | 102017212858 A1 | 1/2019 |
| JP | 2002192370 A | 7/2002 |
| JP | 2004188475 A | 7/2004 |
| JP | 2014221483 A | 11/2014 |
| JP | 2015085347 A | 5/2015 |
| JP | 2017041472 A | 2/2017 |

OTHER PUBLICATIONS

Office Action issued in counterpart German patent application No. 10 2022 211 456.6, dated Dec. 12, 2024.

* cited by examiner

*Primary Examiner* — Thanh T Nguyen
(74) *Attorney, Agent, or Firm* — Greer Burns & Crain Ltd.

(57) ABSTRACT

There is provided a processing method of a workpiece including a necessary region and an unnecessary region. The processing method includes a protective wall forming step of irradiating a region that defines the boundary between the necessary region and the unnecessary region with a laser beam with a wavelength that has transmissibility with respect to the workpiece and forming a plurality of shield tunnels composed of a fine pore and a modified tube that surrounds the fine pore, thereby forming a protective wall, and an unnecessary region removal step of removing the unnecessary region after executing the protective wall forming step.

11 Claims, 5 Drawing Sheets

PROCESSING METHOD

BACKGROUND OF THE INVENTION

Field of the Invention

The present invention relates to a processing method of a workpiece including a necessary region and an unnecessary region.

Description of the Related Art

A wafer in which a plurality of devices such as integrated circuits (ICs) and large-scale integration (LSI) circuits are formed on a front surface in such a manner as to be marked out by a plurality of planned dividing lines that intersect each other is divided into individual device chips by a dicing apparatus or a laser processing apparatus, and the device chips obtained by the dividing are used for pieces of electrical equipment such as mobile phones and personal computers.

The laser processing apparatus is composed substantially of a chuck table that holds a wafer, an imaging unit that images the wafer held by the chuck table and detects a region to be processed, a laser beam irradiation unit that irradiates the wafer held by the chuck table with a laser beam, and a processing feed mechanism that executes processing feed of the chuck table and the laser beam irradiation unit relatively, and can process the wafer with high accuracy (for example, refer to Japanese Patent Laid-open No. 2015-085347).

As types of the laser beam irradiation unit, there are a type that executes irradiation with a laser beam with a wavelength having absorbability with respect to a wafer, to execute ablation processing (for example, refer to Japanese Patent Laid-open No. 2004-188475); a type that executes irradiation with a laser beam with a wavelength having transmissibility with respect to a wafer, to execute internal processing by which a modified layer is formed inside the wafer (for example, refer to Japanese Patent No. 3408805); and a type that executes irradiation with a laser beam with a wavelength having transmissibility with respect to a wafer, in such a manner that a value obtained by dividing the numerical aperture (NA) of a light collector by the refractive index (N) of the wafer is in a range of 0.05 to 0.2 and forms shield tunnels composed of a fine pore and a modified tube that surrounds the fine pore inside the wafer (for example, refer to Japanese Patent Laid-open No. 2014-221483).

SUMMARY OF THE INVENTION

Incidentally, in the case in which a workpiece is, for example, a wafer in which a plurality of devices are formed on a front surface in such a manner as to be marked out by planned dividing lines and a metal layer that is referred to as a test elementary group (TEG) and that is for execution of evaluation and management of the devices is formed on the planned dividing lines, irradiation needs to be executed with the power of a laser beam set high when the planned dividing lines are irradiated with the laser beam and are processed. As a result, there is a problem that a crack attributed to the irradiation with the laser beam develops to a necessary region in which the device is formed outside the planned dividing line and gives damage to the device.

The situation in which the above-described problem occurs is not necessarily limited to the case in which the TEG is disposed on the planned dividing lines. Even when the TEG is not formed on the planned dividing lines, due to the crystal structure of the material that configures a wafer, a crack easily develops to a region outside the planned dividing line in some cases when the planned dividing line is irradiated with a laser beam. Further, the above-described crack problem possibly occurs also when a wafer is divided into individual device chips by cutting the wafer along the planned dividing lines by a cutting blade rotatably held. Moreover, the situation in which such a problem occurs is not limited to the case of executing laser processing along the planned dividing lines of a wafer in which a plurality of devices are formed on a front surface in such a manner as to be marked out by the planned dividing lines. Even in the case of dividing a necessary region with a certain shape from a plate-shaped workpiece by removing an unnecessary region, a problem that a crack develops from the unnecessary region side to the necessary region side and a desired processing result is not obtained possibly occurs.

Thus, an object of the present invention is to provide a processing method by which a desired processing result is obtained without causing a crack to develop to a certain necessary region side in the case of executing, for a workpiece, processing of removing an unnecessary region from the workpiece to obtain the necessary region.

In accordance with an aspect of the present invention, there is provided a processing method of a workpiece including a necessary region and an unnecessary region. The processing method includes a protective wall forming step of irradiating a region that defines a boundary between the necessary region and the unnecessary region with a laser beam having a wavelength that has transmissibility with respect to the workpiece and forming a plurality of shield tunnels composed of a fine pore and a modified tube that surrounds the fine pore, thereby forming a protective wall and an unnecessary region removal step of removing the unnecessary region after executing the protective wall forming step.

Preferably, the shield tunnels formed in the protective wall forming step are formed in such a manner that the modified tubes of the shield tunnels adjacent are in contact with each other. Preferably, the protective wall forming step includes a first protective wall forming step of successively forming the shield tunnels in a planned dividing line with the interposition of at least intervals corresponding to one of the shield tunnels and a second protective wall forming step of successively forming the shield tunnels in regions in which the intervals are interposed in the planned dividing line. Preferably, the shield tunnels formed in the first protective wall forming step and the shield tunnels formed in the second protective wall forming step are formed in such a manner that steps are alternately made in the thickness direction of the workpiece. Preferably, the shield tunnels are stacked in the thickness direction in the protective wall forming step.

Preferably, the protective wall forming step includes a third protective wall forming step of forming shield tunnels above the shield tunnels formed in the first protective wall forming step and a fourth protective wall forming step of forming shield tunnels above the shield tunnels formed in the second protective wall forming step, when the shield tunnels are stacked in the thickness direction. Preferably, in the protective wall forming step, when the shield tunnels are stacked in the thickness direction, the shield tunnels of an upper part are stacked in such a manner as not to be in contact with the shield tunnels of a lower part.

Preferably, the workpiece is a wafer in which a plurality of devices are formed on a front surface in such a manner as to be marked out by a plurality of planned dividing lines that intersect each other, and the necessary region is a region in which the device is formed, and the unnecessary region is a region in which the planned dividing line is formed. Further, in the protective wall forming step, the protective wall is formed on each of opposite sides of the planned dividing line that define the width of the planned dividing line, and, in the unnecessary region removal step, planned dividing line removal processing to remove the planned dividing line that is the unnecessary region sandwiched by the pair of protective walls is executed. Preferably, the planned dividing line removal processing is either laser processing by irradiation with a laser beam or cutting processing executed by a cutting blade. Preferably, the wavelength of the laser beam with which the irradiation is executed in the protective wall forming step is 532 nm, energy per pulse is 2.0 to $4.0 \cdot 10^{-5}$ J, and the interval of a spot is 10 to 15 µm.

The necessary region in the present invention is a region used in another step as it is after being divided from the workpiece by laser processing, cutting processing, or the like, and the unnecessary region is a region that is not used as it is after the processing is executed. For example, the unnecessary region is a discarded region or a region subjected to recycling in some cases.

According to the present invention, even when the unnecessary region is broken to be removed through irradiation with the laser beam with high power or by the cutting blade, development of a crack to the necessary region is prevented by the protective wall and, a problem that damage is given to the necessary region to be divided is eliminated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A laser processing apparatus suitable to execute a processing method of an embodiment of the present invention will be described below with reference to the accompanying drawings, and thereafter, the processing method of the present embodiment will be described.

Figure 1:
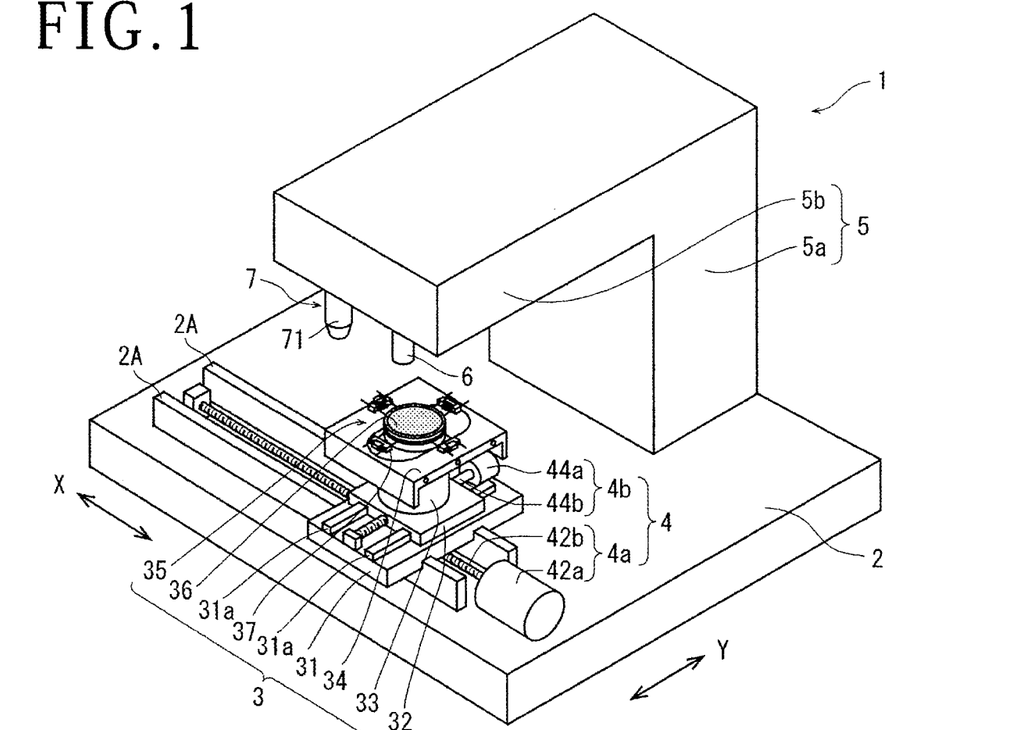
FIG. 1 is an overall perspective view of a laser processing apparatus suitable to execute a processing method according to an embodiment of the present invention.

In FIG. 1, an overall perspective view of a laser processing apparatus 1 is illustrated. The laser processing apparatus 1 includes a holding unit 3 that is disposed over a base 2 and that holds a wafer 10 (see FIG. 2) to be described later, a movement mechanism 4 that moves the holding unit 3 in an X-axis direction and a Y-axis direction, an imaging unit 6 that images the wafer 10 held by the holding unit 3, and a laser beam irradiation unit 7 that irradiates the wafer 10 held by the holding unit 3 with a laser beam, to execute desired processing. Further, the laser processing apparatus 1 includes a frame body 5 composed of a vertical wall part 5a disposed upright on a lateral side of the movement mechanism 4 and a horizontal wall part 5b extending from an upper end part of the vertical wall part 5a in the horizontal direction. The imaging unit 6 and the laser beam irradiation unit 7 are housed and held inside the horizontal wall part 5b.

As illustrated in FIG. 1, the holding unit 3 includes a rectangular X-axis direction movable plate 31 mounted over the base 2 movably in the X-axis direction, a rectangular Y-axis direction movable plate 32 mounted over the X-axis direction movable plate 31 movably in the Y-axis direction, a circular cylindrical support column 33 fixed to an upper surface of the Y-axis direction movable plate 32, and a rectangular cover plate 34 fixed to an upper end of the support column 33. A chuck table 35 that passes through a long hole formed on the cover plate 34 and extends upward is disposed over the cover plate 34. The chuck table 35 is means that holds the wafer 10 by using an XY plane identified based on an X coordinate and a Y coordinate as a holding surface, and is configured rotatably by rotational drive means that is housed in the support column 33 and is not illustrated. At an upper surface of the chuck table 35, a suction adhesion chuck 36 that configures the holding surface formed of a porous material having gas permeability is disposed. The suction adhesion chuck 36 is connected to suction means that is not illustrated, by a flow path passing through the support column 33. Around the suction adhesion chuck 36, four clamps 37 used when the wafer 10 to be described later is held on the chuck table 35 are disposed at equal intervals. The wafer 10 can be held under suction by the suction adhesion chuck 36 by actuating the suction means.

The movement mechanism 4 includes an X-axis movement mechanism 4a that moves the above-described chuck table 35 in the X-axis direction and a Y-axis movement mechanism 4b that moves the chuck table 35 in the Y-axis direction. The X-axis movement mechanism 4a converts rotational motion of a motor 42a to linear motion through a ball screw 42b and transmits the linear motion to the X-axis direction movable plate 31 to move the X-axis direction movable plate 31 in the X-axis direction along a pair of guide rails 2A disposed along the X-axis direction on the base 2. The Y-axis movement mechanism 4b converts rotational motion of a motor 44a to linear motion through a ball screw 44b and transmits the linear motion to the Y-axis direction movable plate 32 to move the Y-axis direction movable plate 32 in the Y-axis direction along a pair of guide rails 31a disposed along the Y-axis direction on the X-axis direction movable plate 31.

The above-described laser processing apparatus 1 is controlled by a controller that is not illustrated. The controller is configured by a computer and includes a central processing unit (CPU) that executes calculation processing according to a control program, a read only memory (ROM) that stores the control program and so forth, a readable-writable random access memory (RAM) for temporarily storing a detection value obtained by detection, a calculation result, and so forth, an input interface, and an output interface (diagrammatic representation about details is omitted). The imaging unit 6, the laser beam irradiation unit 7, the X-axis movement mechanism 4a and the Y-axis movement mechanism 4b that configure the movement mechanism 4, and so forth are connected to the controller and are controlled.

Figure 2:
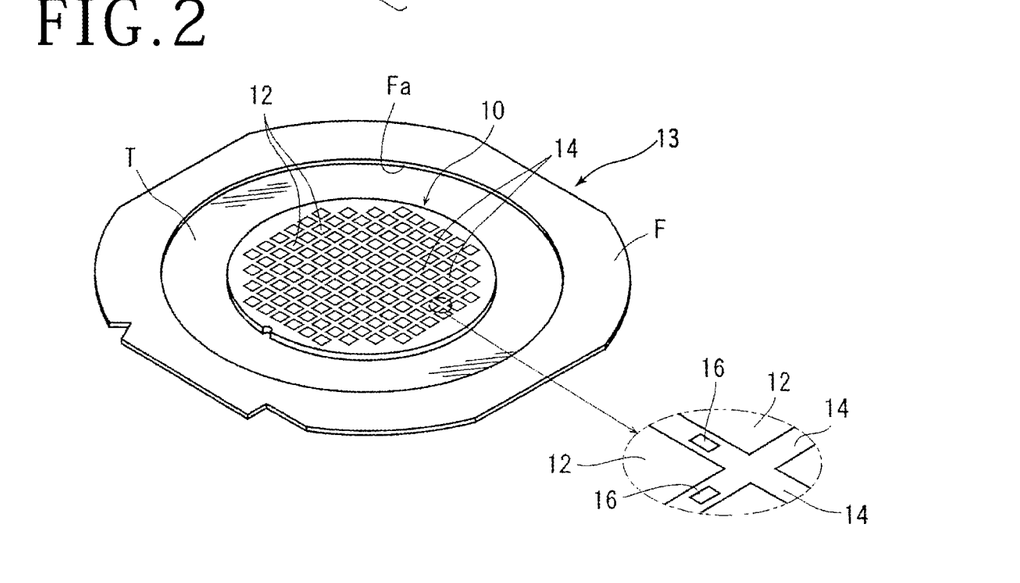
FIG. 2 is a perspective view of a wafer that is a workpiece of the present embodiment.

A workpiece processed by the processing method configured based on the present invention is, for example, the wafer 10 illustrated in FIG. 2. The wafer 10 has a thickness of approximately 100 µm, for example, and is a SiC wafer in which a plurality of devices 12 are formed on a front surface 10a in such a manner as to be marked out by a plurality of planned dividing lines 14 that intersect each other. In processing by the above-described laser processing apparatus 1, the wafer 10 is supported, through an adhesive tape T, by an annular frame F having an opening part Fa that can house the wafer 10, and is loaded into the laser processing apparatus 1 as a wafer unit 13.

In FIG. 2, a perspective view in which part of the wafer 10 is enlarged is illustrated. As is understood from the enlarged perspective view, a TEG 16 that is a metal layer for execution of evaluation and management of the devices 12 is disposed on the planned dividing lines 14 formed in the front surface 10a of the wafer 10 of the present embodiment.

In the processing method of the present embodiment, by executing processing for the wafer 10 as described below, the planned dividing lines 14 that are unnecessary regions in the wafer 10 are removed, and the regions in which the devices 12 are formed as necessary regions are divided into individual chips.

In the processing method of the present embodiment, first, a protective wall forming step of irradiating regions that define the boundary between the region in which the device 12 is formed and which is the necessary region and the planned dividing line 14 that is the unnecessary region with a laser beam with a wavelength that has transmissibility with respect to the wafer 10 and forming a plurality of shield tunnels composed of a fine pore and a modified tube that surrounds the fine pore, thereby forming protective walls is executed. A procedure of executing the protective wall forming step of the present embodiment will be described more specifically.

In execution of the protective wall forming step, after the above-described wafer 10 is prepared, the wafer 10 is placed over the chuck table 35 of the laser processing apparatus 1 illustrated in FIG. 1 and is held under suction, and the frame F is clamped and fixed by the clamps 37. Subsequently, the above-described movement mechanism 4 is actuated, and the wafer 10 is positioned directly under the imaging unit 6 and is imaged to detect position information regarding the devices 12 and the planned dividing lines 14 of the wafer 10. Moreover, based on the position information, the movement mechanism 4 and so forth are actuated, and the predetermined planned dividing line 14 extending in a first direction of the wafer 10 is aligned with the X-axis direction.

Figures 3A, 3B, 3C, 3D, 3E:
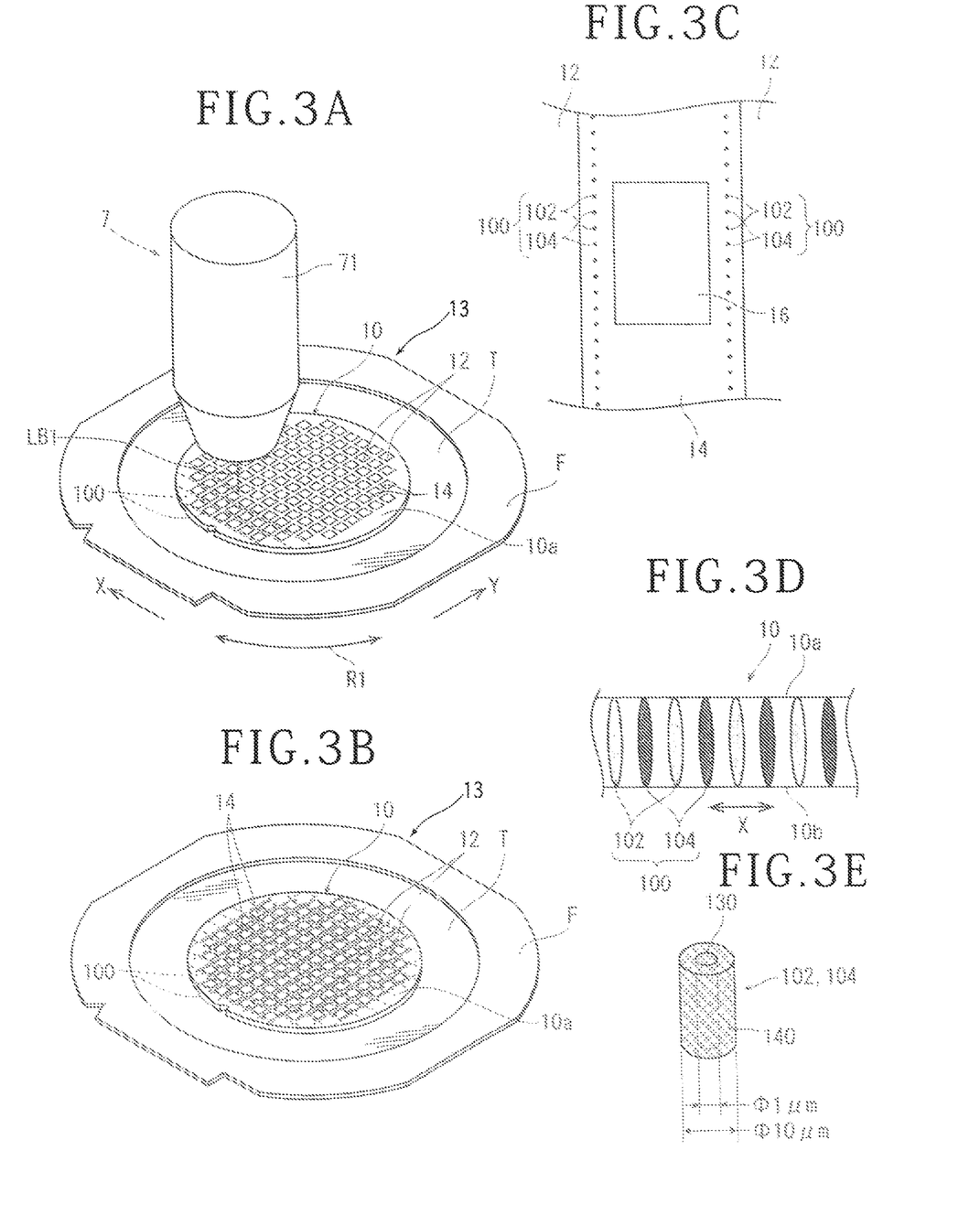
FIG. 3A is a perspective view illustrating a protective wall forming step.
FIG. 3B is a perspective view of a wafer unit for which the protective wall forming step has been completed.
FIG. 3C is a plan view in which part of the wafer for which the protective wall forming step has been executed is illustrated in an enlarged manner.
FIG. 3D is a sectional view in which part of the wafer for which first and second protective wall forming steps have been completed is illustrated in an enlarged manner.
FIG. 3E is a schematic perspective view of a shield tunnel.

Next, as illustrated in FIG. 3A, the wafer 10 is positioned directly under a light collector 71 of the laser beam irradiation unit 7. Then, while the X-axis movement mechanism 4a is actuated to execute processing feed of the wafer 10 in the X-axis direction on the basis of the position information detected by the imaging unit 6, the regions that define the boundary between the device 12 and the planned dividing line 14 are irradiated with a laser beam LB1. As a result, two streaks of protective walls 100 are formed as is understood from FIG. 3C in which part of the planned dividing line 14 is illustrated in an enlarged manner. In the present embodiment, the regions that define the boundary between the device 12 and the planned dividing line 14 are regions on both sides of the planned dividing line 14 that define the width of the planned dividing line 14 that is the unnecessary region, as is understood from FIG. 3C.

In the irradiation with the above-described laser beam LB1, the numerical aperture (NA) of a collecting lens that configures the light collector 71 of the laser beam irradiation unit 7 of the present embodiment is set in such a manner that a value obtained by dividing the NA by the refractive index (N) of the wafer 10 falls within a range of 0.05 to 0.2, for example. Further, the wavelength of the laser beam LB1 is set to 532 nm, which is a wavelength having transmissibility with respect to the wafer 10. The average output power is set to 0.2 to 0.4 W, and the repetition frequency is set to 10 kHz. The energy per pulse is set to 2.0 to $4.0 \cdot 10^{-5}$ J, and the interval of the spot is set to 10 to 15 µm. By positioning the focal points to the inside of the wafer 10 and executing irradiation with the laser beam LB1 on the basis of such a laser processing condition, shield tunnels 102 and 104 are formed as illustrated in FIG. 3D. As illustrated in FIG. 3E, the shield tunnels 102 and 104 are composed of a fine pore 130 and a modified tube 140 that surrounds the fine pore 130. For example, the diameter of the fine pore 130 is approximately 1 µm, and the diameter of the modified tube 140 is approximately 10 µm. The above-described protective walls 100 are formed along the planned dividing line 14 by successively forming the shield tunnels 102 and 104 adjacent to each other. The energy per pulse regarding the laser beam LB1 with which irradiation is executed when the protective walls 100 are formed is set to a value at such a degree that the protective walls 100 do not become starting points of dividing when the wafer 10 is divided along the planned dividing lines 14.

In the formation of the protective walls 100 illustrated in FIGS. 3C and 3D, for example, a first protective wall forming step of successively forming the shield tunnels 102 with the interposition of at least intervals (approximately 10 to 13 µm) corresponding to one shield tunnel along the above-described regions that define the boundary between the device 12 and the planned dividing line 14 is first executed. Subsequently, a second protective wall forming step of successively forming the shield tunnels 104 for the regions in which the intervals are interposed is executed. That is, the shield tunnels 102 and the shield tunnels 104 are alternately formed along the X-axis direction to form the protective walls 100. By executing the first protective wall forming step and the second protective wall forming step with the interposition of an interval in terms of time in the formation of the protective walls 100 as above, the influence of a hot spot caused when irradiation with the laser beam LB1 is executed to successively form shield tunnels adjacent to each other is avoided and, development of a crack to the necessary region (region in which the device 12 is formed) caused when the shield tunnels 102 and 104 are formed can be avoided.

The purpose of executing the first protective wall forming step and the second protective wall forming step with the interposition of an interval in terms of time in the above-described embodiment is to avoid the influence of a hot spot as described above. This is because, when only the first protective wall forming step is executed with the interval of the shield tunnels 102 shortened, diffusion of heat generated when the shield tunnels 102 are formed is not sufficient and it is impossible to avoid development of a crack to the necessary region (region in which the device 12 is formed). Preferably, the laser processing condition is the same between the first protective wall forming step and the second protective wall forming step. However, different laser processing conditions may be employed.

After two streaks of the protective walls 100 composed of the shield tunnels 102 and 104 are formed along the predetermined planned dividing line 14 in the first direction as described above, indexing feed of the wafer 10 is executed in the Y-axis direction, and the planned dividing line 14 that is adjacent in the Y-axis direction, that has not yet been processed, and that extends in the first direction is positioned directly under the light collector 71. Then, the focal points of the laser beam LB1 are positioned to the inside of the regions that define the width of the planned dividing line 14 of the wafer 10, and irradiation is executed similarly to the above description to sequentially execute the above-described first protective wall forming step and second protective wall forming step.

As a result, the shield tunnels 102 and 104 are formed to form two streaks of the protective walls 100. Similarly, processing feed and indexing feed of the wafer 10 are executed in the X-axis direction and the Y-axis direction, and two streaks of the protective walls 100 are formed along all planned dividing lines 14 extending in the first direction. Subsequently, the wafer 10 is rotated by 90 degrees in a direction indicated by an arrow R1, and the planned dividing lines 14 extending in a second direction orthogonal to the planned dividing lines 14 along which the protective walls 100 have already been formed are aligned with the X-axis direction. Then, the focal points of the laser beam LB1 are positioned and irradiation is executed similarly to the above description also for the inside of the regions that define the boundaries between the remaining devices 12 and the planned dividing lines 14 and, as illustrated in FIG. 3B, the protective walls 100 are formed corresponding to all planned dividing lines 14 formed in the front surface 10a of the wafer 10. This completes the protective wall forming step of the present embodiment.

After the above-described protective wall forming step is executed, an unnecessary region removal step of removing the planned dividing lines 14 that are the unnecessary regions is executed. More specifically, the wafer 10 in which the above-described protective walls 100 have been formed corresponding to all planned dividing lines 14 is conveyed to a laser processing apparatus 20 illustrated in FIG. 4A (only part thereof is illustrated). The laser processing apparatus 20 includes a holding unit that is not illustrated, a laser beam irradiation unit 21 that irradiates the wafer 10 held by the holding unit with a laser beam LB2, X-axis feed means that executes processing feed of the holding unit and the laser beam irradiation unit 21 relatively in the X-axis direction, Y-axis feed means that executes indexing feed of the holding unit and the laser beam irradiation unit 21 relatively in the Y-axis direction orthogonal to the X-axis direction, and rotational drive means that rotates the holding unit (none is illustrated).

Figure 4A:
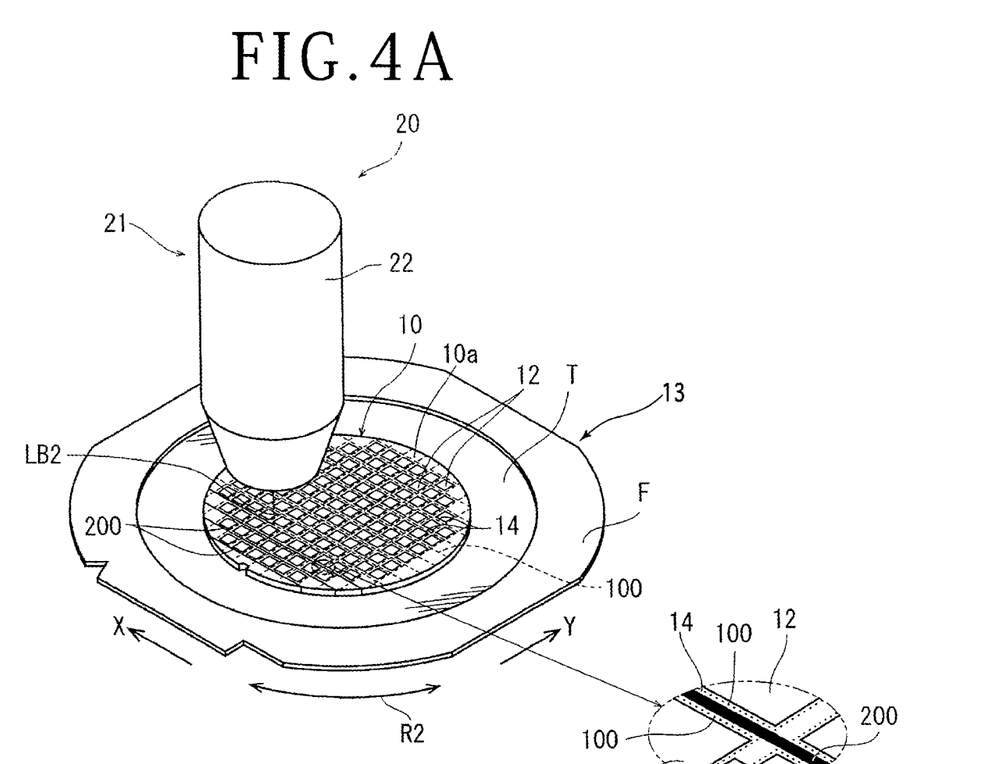
FIG. 4A is a perspective view of a form in which an unnecessary region removal step is executed by laser processing.

For the wafer 10 that is conveyed to the laser processing apparatus 20 and is held by the holding unit, an alignment step is executed by using alignment means (not illustrated) disposed in the laser processing apparatus 20, and the position of the planned dividing lines 14 formed in the front surface 10a is detected. In addition, the wafer 10 is rotated by the rotational drive means, and the planned dividing lines 14 in the first direction are aligned with the X-axis direction. Information regarding the detected position of the planned dividing lines 14 is stored in a controller that is not illustrated.

Based on the position information regarding the planned dividing lines 14 detected by the above-described alignment step, a light collector 22 of the laser beam irradiation unit 21 is positioned to a processing start position of the predetermined planned dividing line 14 extending in the first direction. Then, the focal point of the laser beam LB2 is positioned to the front surface 10a of the wafer 10, irradiation is executed, and processing feed of the wafer 10 together with the holding unit is executed in the X-axis direction, to execute ablation processing along the predetermined planned dividing line 14 extending in the first direction. As a result, a removal groove 200 that divides the wafer 10 along the planned dividing line 14 is formed. As illustrated on the right side of FIG. 4A on which part of the wafer 10 is illustrated in an enlarged manner, the removal groove 200 is formed to remove the unnecessary region sandwiched by the protective walls 100 formed on both sides that define the width of the planned dividing line 14. The laser beam LB2 emitted from the laser beam irradiation unit 21 is a laser beam with a wavelength (for example, 355 nm) having absorbability with respect to, for example, SiC that configures the wafer 10.

After the removal groove 200 is formed along the predetermined planned dividing line 14 extending in the first direction as described above, indexing feed of the wafer 10 is executed in the Y-axis direction by the interval of the planned dividing lines 14, and the planned dividing line 14 that is adjacent to the predetermined planned dividing line 14 in the Y-axis direction and that has not yet been processed is positioned directly under the light collector 22. Then, the focal point of the laser beam LB2 is positioned to a front surface of the planned dividing line 14 of the wafer 10, and irradiation is executed similarly to the above description, and processing feed of the wafer 10 is executed in the X-axis direction to form the removal groove 200. Similarly, processing feed and indexing feed of the wafer 10 are executed in the X-axis direction and the Y-axis direction, and the removal grooves 200 are formed along the planned dividing lines 14 extending in the first direction.

Figure 4B:
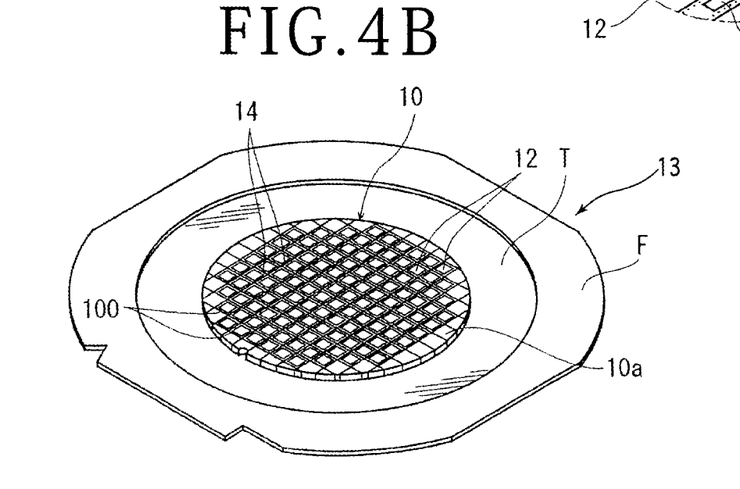
FIG. 4B is a perspective view of the wafer unit for which the unnecessary region removal step has been completed.

Subsequently, the wafer 10 is rotated by 90 degrees in a direction indicated by an arrow R2, and the planned dividing lines 14 extending in a second direction that is a direction orthogonal to the planned dividing lines 14 in the first direction in which the removal grooves 200 have already been formed and in which the removal grooves 200 have not yet been formed are aligned with the X-axis direction. Then, the focal point of the laser beam LB2 is positioned, and irradiation is executed similarly to the above description also for the remaining planned dividing lines 14. As a result, planned dividing line removal processing to form the removal grooves 200 along all planned dividing lines 14 formed in the wafer 10, as illustrated in FIG. 4B, is executed. Through the above, the devices 12 are divided from the wafer 10, and the unnecessary region removal step is completed.

The unnecessary region removal step executed in the present invention is not limited to the laser processing by irradiation with the above-described laser beam LB2. For example, the wafer 10 in which the protective walls 100 are formed in all planned dividing lines 14 may be conveyed to a cutting apparatus 50 illustrated in FIG. 5 (only part thereof is illustrated), and the unnecessary region removal step may be executed by the cutting apparatus 50.

The cutting apparatus 50 includes a chuck table (not illustrated) that holds the wafer 10 under suction and a cutting unit 52 that cuts the wafer 10 held under suction by the chuck table. The chuck table is rotatably configured and includes a movement mechanism (not illustrated) that executes processing feed of the chuck table in a direction indicated by an arrow X in FIG. 5. Further, the cutting unit 52 includes a spindle 54 rotatably held by a spindle housing 53 disposed in the Y-axis direction indicated by an arrow Y in FIG. 5 and an annular cutting blade 56 held by the tip of the spindle 54, and includes a Y-axis movement mechanism (not illustrated) that executes indexing feed of the cutting blade 56 in the Y-axis direction. The spindle 54 is rotationally driven by a spindle motor that is not illustrated.

Figure 5:
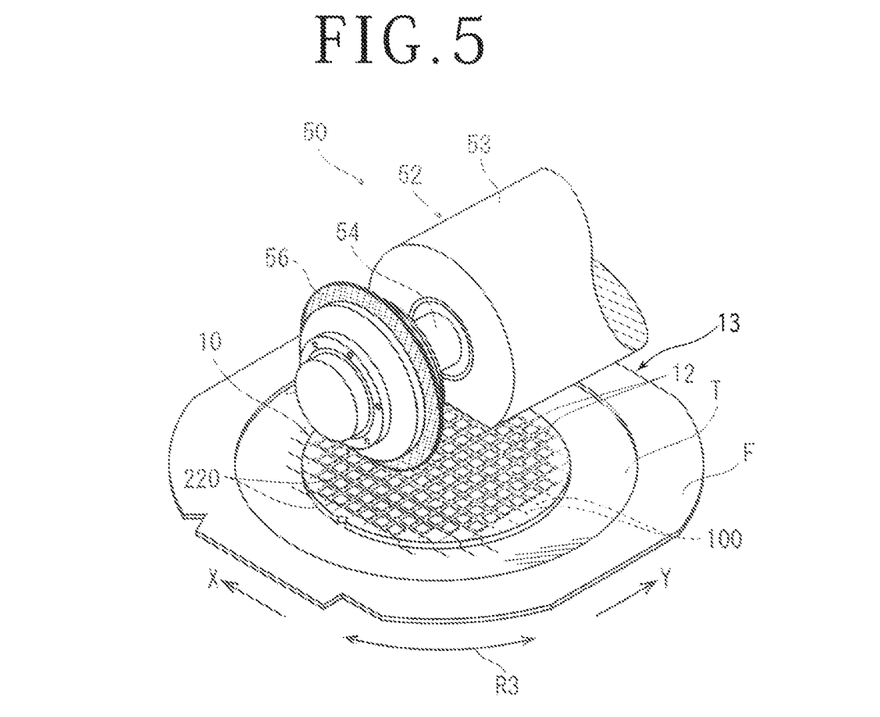
FIG. 5 is a perspective view illustrating a mode in which the unnecessary region removal step is executed by cutting processing.

In execution of the unnecessary region removal step, first, the wafer 10 is placed over the chuck table of the cutting apparatus 50 and is held under suction with the front surface 10a of the wafer 10 oriented upward, and the planned dividing lines 14 extending in the first direction of the wafer 10 are aligned with the X-axis direction. In addition, position adjustment with the cutting blade 56 is executed. Subsequently, the cutting blade 56 rotated at high speed is positioned, in the planned dividing lines 14 aligned with the X-axis direction, to the unnecessary region sandwiched by the protective walls 100 formed on both sides that define the width of the planned dividing line 14, and is caused to cut into the wafer 10 from the side of the front surface 10a. In addition, processing feed of the chuck table is executed in the X-axis direction to form a removal groove 220 that divides the wafer 10. Moreover, indexing feed of the cutting blade 56 of the cutting unit 52 is executed on the planned dividing line 14 that is adjacent in the Y-axis direction to the planned dividing line 14 in which the removal groove 220 has been formed and that does not have the removal groove 220 formed therein, and cutting processing to form the removal groove 220 similarly to the above description is executed. By repeating them, the removal grooves 220 are formed along all planned dividing lines 14 along the X-axis direction.

Subsequently, the chuck table is rotated by 90 degrees in a direction indicated by an arrow R3, and the second direction orthogonal to the first direction in which the removal grooves 220 have been formed first is aligned with the X-axis direction. Then, the above-described cutting processing is executed for all planned dividing lines 14 newly aligned with the X-axis direction, to form the removal grooves 220 along all planned dividing lines 14 formed in the wafer 10. The cutting step is executed in this manner, and the planned dividing line removal processing to divide the wafer 10 into device chips of each device 12 along the planned dividing lines 14 is executed, and the unnecessary region removal step is completed, so that the devices 12 that are the necessary regions are divided similarly to the wafer 10 illustrated in FIG. 4B.

As described above, in the present embodiment, before execution of the unnecessary region removal step of removing the planned dividing lines 14 that are the unnecessary regions, the regions that define the boundary between the necessary region in which the device 12 is formed and the unnecessary region in which the planned dividing line 14 is formed are irradiated with the laser beam with a wavelength having transmissibility with respect to the wafer 10, and the shield tunnels 102 and 104 composed of the fine pore and the modified tube that surrounds the fine pore are formed to form the protective walls 100. Thus, even when the planned dividing lines 14 are broken to be removed through irradiation with the laser beam with high power or by the cutting blade, development of a crack to the region in which the device 12 is formed and which is the necessary region is prevented by the protective walls 100, and the problem that damage is given to the devices 12 to be individually divided is eliminated.

The present invention is not limited to the above-described embodiment. In the formation of the shield tunnels in the above-described protective wall forming step, the shield tunnels may be formed to be stacked by shifting the position of the focal point in the upward-downward direction when irradiation with the laser beam LB1 is executed in the thickness direction of the wafer 10. For example, in the protective wall forming step executed for the wafer 10 with a thickness of 500 μm, as is understood from a sectional view of the wafer 10 illustrated in FIG. 6, the first protective wall forming step of successively forming shield tunnels 111 in the planned dividing line 14 aligned with the X-axis direction of the wafer 10 with the interposition of at least intervals corresponding to one shield tunnel is executed, and the second protective wall forming step of successively forming shield tunnels 112 in the regions in which the intervals are interposed in the planned dividing line 14 is executed. Subsequently, a third protective wall forming step of forming shield tunnels 113 above the formed shield tunnels 111 may be executed, and a fourth protective wall forming step of forming shield tunnels 114 above the shield tunnels 112 formed in the second protective wall forming step may be executed. In the embodiment illustrated in FIG. 6, a protective wall 110 is formed through execution of fifth and sixth protective wall forming steps of forming shield tunnels 115 and 116 further stacked above the shield tunnels 113 and 114, in addition to the above-described first to fourth protective wall forming steps. Further, the focal point when irradiation with the laser beam LB1 to form the shield tunnels 111 to 116 is executed is positioned in such a manner as to be shifted in the upward-downward direction, and the shield tunnels 111 to 116 are stacked in the thickness direction. This makes it possible to effectively form the protective walls 110 that prevent development of a crack even for a thick workpiece.

Figure 6:
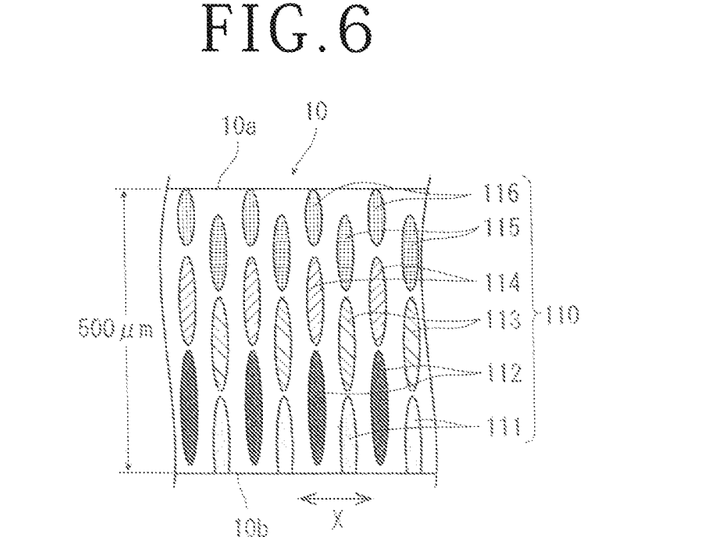
FIG. 6 is a partially enlarged sectional view illustrating another embodiment of the protective wall forming step.

In the embodiment illustrated in FIG. 6, in the execution of the second protective wall forming step after the execution of the first protective wall forming step, the shield tunnels 111 formed in the first protective wall forming step and the shield tunnels 112 formed in the second protective wall forming step are formed in such a manner that steps are alternately made in the thickness direction of the wafer 10. Owing to this, when processing to remove the unnecessary region is executed for a thick workpiece, influence attributed to a hot spot is avoided more effectively, and development of a crack to the necessary region is prevented by the protective walls 110. In the present embodiment, steps are alternately made in the thickness direction also when the shield tunnels 113 to 116 are formed in the third to sixth protective wall forming steps. In the above-described first to sixth protective wall forming steps, when the shield tunnels are stacked in the thickness direction, the shield tunnels of the upper part are stacked in such a manner as not to be in contact with the shield tunnels of the lower part. This can suppress the occurrence of a crack in a case in which the shield tunnels of the upper part are formed to be in contact with the shield tunnels of the lower part. Further, when the shield tunnels are formed in such a manner that the modified tubes of adjacent shield tunnels are in contact with each other in the protective wall forming step, it is possible to effectively prevent development of a crack from the unnecessary region to the necessary region when the unnecessary region removal step is executed.

Figure 7:
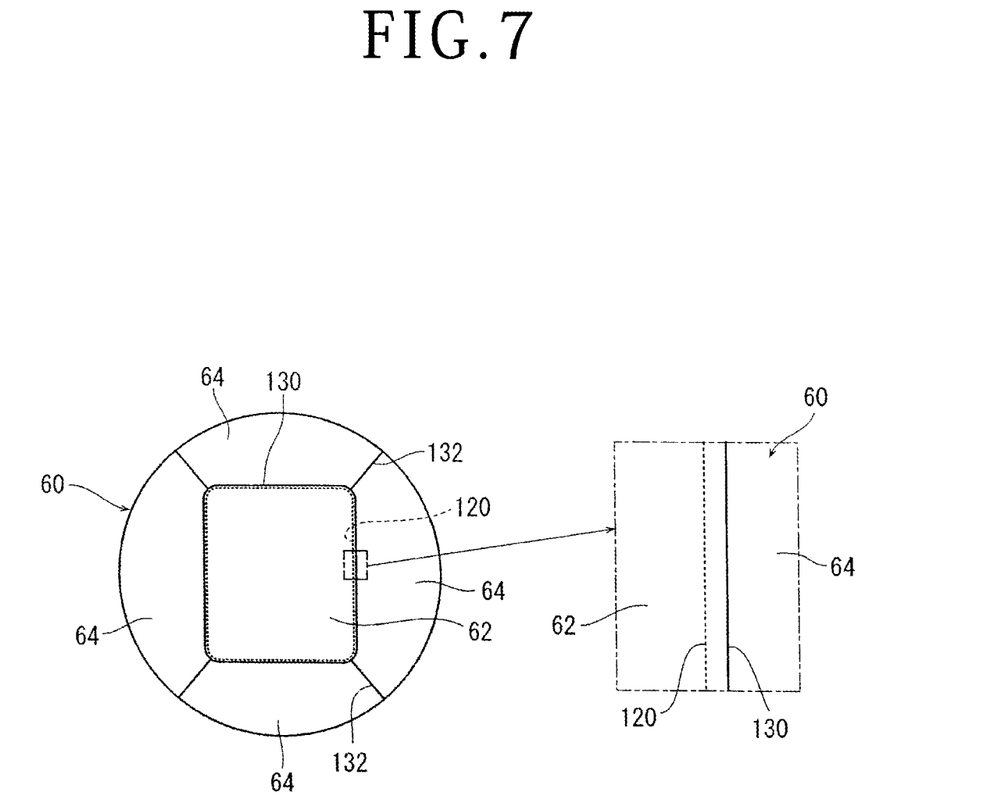
FIG. 7 is a plan view illustrating still another embodiment of the workpiece.

Moreover, in the above-described embodiment, description has been made about the case in which the workpiece is the wafer 10 in which the plurality of devices 12 are formed on the front surface 10a in such a manner as to be marked out by the plurality of planned dividing lines 14 that intersect each other. However, the present invention is not limited thereto. For example, the workpiece may be a circular plate-shaped member 60 of SiC formed of a necessary region 62 marked out with a substantially rectangular shape at the center illustrated on the left side of FIG. 7 and an unnecessary region 64 on the outer circumferential side that surrounds the necessary region 62. When the plate-shaped member 60 is processed by the processing method of the present invention, the plate-shaped member 60 is held by an annular frame that is not illustrated through an adhesive tape and is conveyed to the above-described laser processing apparatus 1. Subsequently, executed is the protective wall forming step in which the focal point of a laser beam with a wavelength, for example, 532 nm, having transmissibility with respect to the plate-shaped member 60 is positioned to the inside of a region that defines the boundary between the necessary region 62 and the unnecessary region 64, irradiation is executed, and the shield tunnels composed of the fine pore and the modified tube that surrounds the fine pore are formed to form a protective wall 120 along the outer circumferential of the necessary region 62. Detailed description of this protective wall forming step is omitted because it is a step executed under a condition similar to that of the protective walls 100 and 110 of the above-described protective wall forming steps.

After the protective wall 120 is formed as described above, the unnecessary region removal step of removing the unnecessary region 64 surrounding the necessary region 62 along the protective wall 120 is executed. The unnecessary region removal step is executed by laser processing by the above-described laser processing apparatus 20, for example. As illustrated on the right side of FIG. 7 on which part of the plate-shaped member 60 is illustrated in an enlarged manner, irradiation with the above-described laser beam LB2 with a wavelength having absorbability with respect to the plate-shaped member 60 is executed along the outside of the protective wall 120, and a first removal groove 130 that divides the plate-shaped member 60 is formed. Further, a plurality of second removal grooves 132 radially extending from the above-described first removal groove 130 to the outer circumferential edge of the plate-shaped member 60 are formed. By forming the first removal groove 130 and the second removal grooves 132 in this manner, the unnecessary region 64 of the plate-shaped member 60 is removed, and only the necessary region 62 can be obtained. At this time, a problem that a crack develops from the unnecessary region 64 to the necessary region 62 and the necessary region 62 is damaged does not occur.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a workpiece including a necessary region and an unnecessary region, the processing method comprising:
   a protective wall forming step of irradiating a region that defines a boundary between the necessary region and the unnecessary region with a laser beam having a wavelength that has transmissibility with respect to the workpiece and forming a plurality of shield tunnels including at least a plurality of first shield tunnels and a plurality of second shield tunnels, each of the shield tunnels being composed of a fine pore and a modified tube that surrounds the fine pore, thereby forming a protective wall; and
   an unnecessary region removal step of removing the unnecessary region after executing the protective wall forming step,
   wherein the protective wall forming step includes:
     a first protective wall forming step of successively forming the plurality of first shield tunnels in a planned dividing line with interposition of intervals in the planned dividing line between adjacent two of the plurality of the first shield tunnels, and
     a second protective wall forming step of successively forming the plurality of second shield tunnels in the planned dividing line at the intervals between the adjacent two of the first shield tunnels formed in the first protective wall forming step.

2. The processing method according to claim 1, wherein the shield tunnels formed in the protective wall forming step are formed in such a manner that the modified tubes of the shield tunnels adjacent are in contact with each other.

3. The processing method according to claim 1, wherein the first shield tunnels formed in the first protective wall forming step and the second shield tunnels formed in the second protective wall forming step are formed in such a manner that steps are alternately made in a thickness direction of the workpiece.

4. The processing method according to claim 1, wherein the shield tunnels are stacked in a thickness direction in the protective wall forming step.

5. The processing method according to claim 4, wherein the protective wall forming step includes a third protective wall forming step of forming a plurality of third shield tunnels above the first shield tunnels formed in the first protective wall forming step and a fourth protective wall forming step of forming a plurality of fourth shield tunnels above the second shield tunnels formed in the second protective wall forming step, when the shield tunnels are stacked in the thickness direction.

6. The processing method according to claim 4, wherein, in the protective wall forming step, when the shield tunnels are stacked in the thickness direction, the shield tunnels of an upper part are stacked in such a manner as not to be in contact with the shield tunnels of a lower part.

7. The processing method according to claim 1, wherein the workpiece is a wafer in which a plurality of devices are formed on a front surface in such a manner as to be marked out by a plurality of planned dividing lines that intersect each other,
   the necessary region is a region in which the device is formed, and the unnecessary region is a region in which the planned dividing line is formed, in the protective wall forming step, the protective wall is formed on each of opposite sides of the planned dividing line that define a width of the planned dividing line, and, in the unnecessary region removal step, planned dividing line removal processing to remove the planned dividing line that is the unnecessary region sandwiched by the pair of protective walls is executed.

8. The processing method according to claim 7, wherein the planned dividing line removal processing is laser processing by irradiation with a laser beam or cutting processing executed by a cutting blade.

9. The processing method according to claim 1, wherein the wavelength of the laser beam with which the irradiation is executed in the protective wall forming step is 532 nm, energy per pulse is 2.0 to $4.0 \cdot 10^{-5}$ J, and an interval of a spot is 10 to 15 µm.

10. The processing method according to claim 1, wherein approximately half of the length of each of the plurality the second shield tunnels overlaps the plurality of first shield tunnels in a thickness direction of the wafer.

11. The processing method according to claim 1, wherein the plurality of first shield tunnels and the plurality of second shield tunnels have a same predetermined length in the thickness direction of the wafer, and the plurality of first shield tunnels and the plurality of second shield tunnels overlap along the entire predetermined length.

* * * * *